United States Patent
Stenberg et al.

(10) Patent No.: US 10,816,578 B2
(45) Date of Patent: Oct. 27, 2020

(54) SYSTEM AND METHOD FOR FILTERING HARMONIC FREQUENCIES IN AN ELECTRICAL ENERGY METER

(71) Applicant: Landis+Gyr LLC, Lafayette, IN (US)

(72) Inventors: David Stenberg, West Lafayette, IN (US); David Bobick, West Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 425 days.

(21) Appl. No.: 15/785,857

(22) Filed: Oct. 17, 2017

(65) Prior Publication Data
US 2019/0113551 A1    Apr. 18, 2019

(51) Int. Cl.
*G01R 22/06* (2006.01)
*G01R 22/10* (2006.01)

(52) U.S. Cl.
CPC .......... *G01R 22/061* (2013.01); *G01R 22/10* (2013.01)

(58) Field of Classification Search
CPC .................................................. G01R 22/061
USPC .......................................................... 702/61
See application file for complete search history.

(56) References Cited

U.S. PATENT DOCUMENTS

| | | | |
|---|---|---|---|
| 5,301,121 A | 4/1994 | Garverick et al. | |
| 5,485,393 A * | 1/1996 | Bradford | G01R 21/003 324/142 |
| 5,731,965 A | 3/1998 | Cheng et al. | |
| 6,466,465 B1 * | 10/2002 | Marwali | H02M 1/32 361/79 |
| 7,006,934 B2 | 2/2006 | Jonker et al. | |
| 7,072,779 B2 | 7/2006 | Hancock et al. | |
| 8,026,628 B2 * | 9/2011 | Swarztrauber | G01D 4/004 307/3 |
| 8,862,435 B2 | 10/2014 | Spanier et al. | |
| 9,194,898 B2 | 11/2015 | Banhegyesi et al. | |
| 9,634,489 B2 | 4/2017 | Rosendahl | |
| 2005/0062631 A1 * | 3/2005 | Washburn | H03M 1/661 341/144 |
| 2008/0097707 A1 * | 4/2008 | Voisine | G01R 21/1331 702/61 |

* cited by examiner

*Primary Examiner* — Ricky Ngon
(74) *Attorney, Agent, or Firm* — Kilpatrick Townsend & Stockton LLP

(57) ABSTRACT

An electrical energy meter includes an A/D converter and a processing circuit. The A/D converter is configured to generate digital samples of voltage and current waveforms in a polyphase electrical system. The processing circuit is operably coupled to receive the digital samples from the A/D converter and to integrate over time at least one digital sample multiple times to produce a filtered value from which harmonic distortion has been removed, identify a fundamental frequency only electrical parameter measurement for the polyphase electrical system with reference to the filtered value, and store the identified fundamental frequency only electrical parameter measurement in a data store.

20 Claims, 5 Drawing Sheets

SYSTEM AND METHOD FOR FILTERING HARMONIC FREQUENCIES IN AN ELECTRICAL ENERGY METER

FIELD OF THE INVENTION

The present invention relates generally to electricity measurements, and more particularly, to measurement of a fundamental frequency for a signal and the filtering of harmonic distortion in the signal.

BACKGROUND

One of the goals of electricity metering is to accurately measure the use or consumption of electrical energy resources. With such measurements, the cost of generating and delivering electricity metering helps identify electrical energy generation and delivery needs. For example, cumulative electricity consumption measurements for a service area can help determine the appropriate sizing of transformers and other equipment.

In a typical electrical distribution system, electrical energy is generated by an electrical supplier or utility company and distributed to consumers through a power distribution network. The power distribution network is a network of electrical distribution wires that link the electrical supplier to its consumers. Typically, electricity from a utility is fed from a primary substation over a distribution cable to several local substations. At the substations, the electricity is transformed by distribution transformers from a relatively high voltage on the distribution cable to a lower voltage signal that is supplied to the consumer. From the substations, the power is provided to industrial users over a distributed power network that supplies power to various loads within the consumer's facility. Such loads may include, for example, various power machines.

At the consumer's facility, an electrical energy meter ("revenue meter") is typically connected between the electrical input connection to the consumer's facility and the power distribution network to measure the consumption of electrical energy by the consumer's facility. The revenue meter is an electrical energy measurement device which accurately measures the amount of electrical energy flowing to the consumer from the power distribution network. The amount of electrical energy measured by the meter is used to bill the consumer for the energy used by the consumer's facility.

Typically, the electrical energy is delivered to consumers as an alternating current ("AC") voltage that approximates a sine wave over a time period. The term "alternating waveform" generally describes any symmetrical waveform, including square, sawtooth, triangular, and sinusoidal waves, whose polarity varies regularly with time. The term "AC" (alternating current), however, usually means the current is produced from the application of a sinusoidal voltage, which is an AC voltage. The expected frequency of the AC voltage is typically 50 cycles/second or Hertz ("Hz"), 60 Hz, or 400 Hz, and is usually called the "fundamental" frequency. Integer multiples of this fundamental frequency are usually referred to as harmonic frequencies.

While the fundamental frequency is the expected frequency at which the electrical energy is delivered to the consumer's facility, the harmonic frequencies in the AC voltage signal can distort the electricity measurements made by a meter. Therefore, accurately identifying the fundamental frequency of the delivered AC voltage is important. Failure to remove the harmonic frequencies from the delivered AC voltage signal can adversely affect the accurate determination of the actual energy delivered to the consumer. Improving the removal of harmonic frequencies from the AC signal being measured by a meter would be particularly useful.

SUMMARY OF THE INVENTION

An improved electrical energy meter attenuates harmonic distortion in an electrical power signal monitored by the meter. The electrical energy meter includes a) an A/D converter configured to generate contemporaneously digital samples of voltage and current waveforms in a polyphase electrical system, and b) a processing circuit operably coupled to receive the digital samples from the A/D converter. The processing circuit is configured to (1) integrate over time at least one digital sample multiple times to produce a filtered value from which harmonic distortion has been removed, (2) identify a fundamental frequency only electrical parameter measurement for the polyphase electrical system with reference to the filtered value, and (3) store the identified fundamental frequency only electrical parameter measurement in a data store.

A method is performed by an electrical energy meter to attenuate harmonic distortion in an electrical power signal monitored by the meter. The method includes generating contemporaneously with an A/D converter digital samples of voltage and current waveforms in a polyphase electrical system, receiving with a processing circuit the digital samples from the A/D converter, integrating with the processing circuit over time at least one digital sample multiple times to produce a filtered value from which harmonic distortion has been removed, identifying with the processing circuit a fundamental frequency only electrical parameter measurement for the polyphase electrical system with reference to the filtered value, and storing the identified fundamental frequency only electrical parameter measurement in a data store.

DETAILED DESCRIPTION

The features and advantages of the meter and method described in this document will become more readily apparent to those of ordinary skill in the art by reference to the following detailed description and accompanying drawings.

Figure 1:
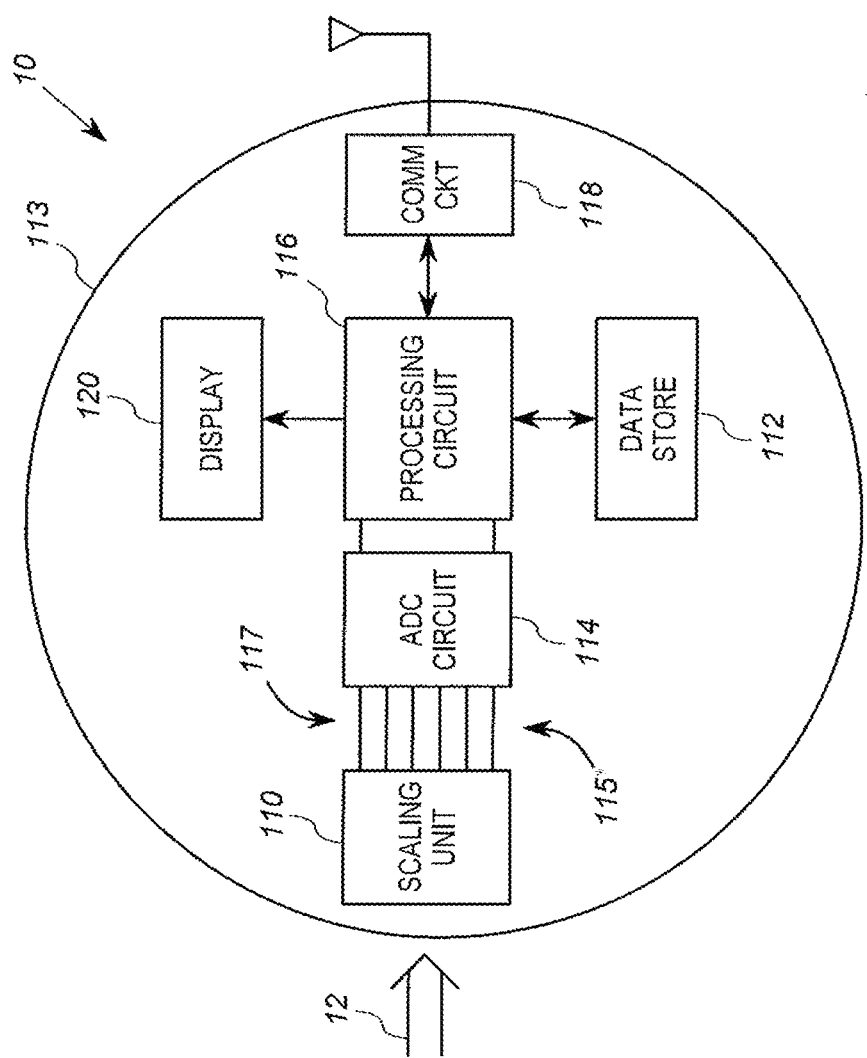
FIG. 1 shows an exemplary meter that may be used in one or more embodiments of the present invention.

FIG. 1 shows an exemplary embodiment of a polyphase electrical energy meter 10 that can be configured to reduce harmonic distortion in a monitored signal within the meter by multiple integrations. Referring to FIG. 1 specifically, the meter 10 is an apparatus for measuring energy consumption that includes a scaling circuit 110, an analog-to-digital conversion ("ADC") circuit 114, a processing circuit 116, a communication circuit 118, an optional display 120, and a data store 112. All of the above listed elements are preferably supported by a meter housing 113, which may take a plurality of known forms. The communication circuit 118 may be disposed within an interior of the meter housing 113 like the other devices, or may be affixed to the outside of the meter housing 113.

Figure 2:
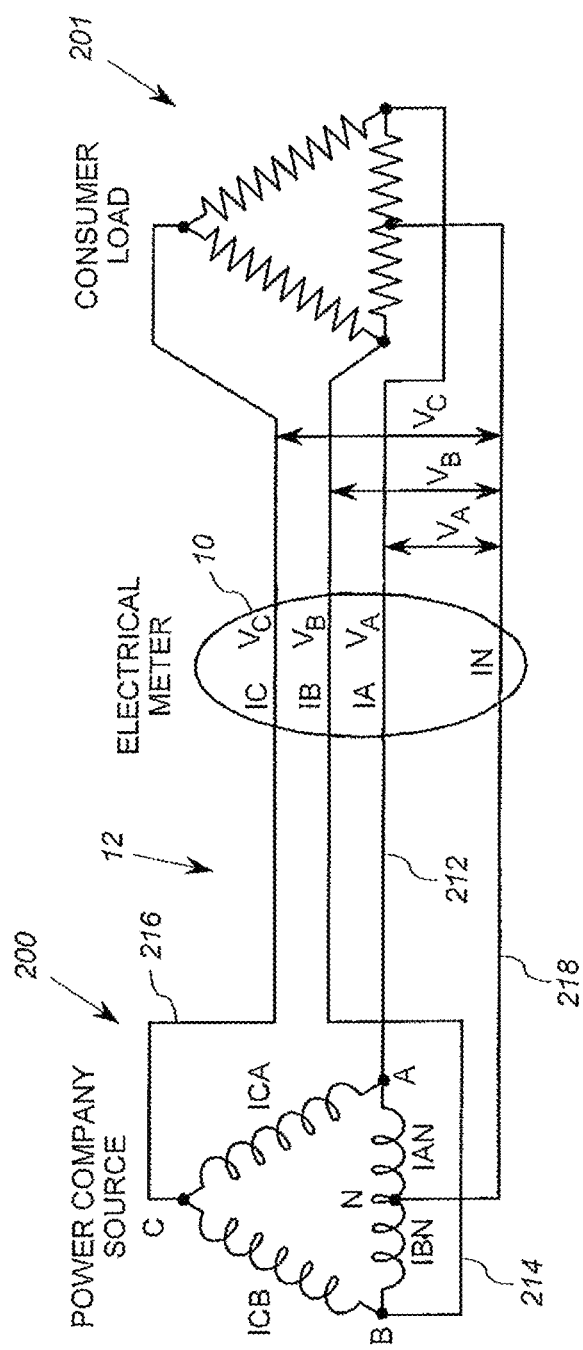
FIG. 2 shows a measurement configuration in which an embodiment of the invention may be employed.

In the embodiment described herein, the scaling circuit 110 and the ADC circuit 114 are arranged to generate digital signals representative of line voltage waveforms $V_A$, $V_B$, $V_C$ for each of three phases A, B, C of a four-wire delta electrical system and other digital signals representative of at least three of the four-line current waveforms $I_A$, $I_B$, $I_C$ and $I_N$ of the four-wire delta electrical system, which are illustrated in FIG. 2. The meter 10, however, may readily be configured for a three-wire delta electrical service, as well as other types of electrical service. The digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 112, or preferably some combination of the foregoing operations. In accordance with the embodiments described herein, the processing circuit 116 is further operable to perform any or all of the calculations described herein.

In a further detailed description of the meter 10 of FIG. 1, the scaling circuit 110 may suitably comprise current and voltage sensors, not shown. The voltage sensors, which may, for example, include voltage dividers, generate a scaled down version of the voltage present on phases of the power lines 12. The current sensors, which may suitably include current transformers, shunts, embedded coil devices and the like, generate a voltage or current signal that is a scaled down version of the current present on the phases of the power lines 12. Various voltage and current sensors are known in the art.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. Nos. 6,374,188; 6,564,159; 6,121,158 and 5,933,004, all of which are incorporated herein by reference. Moreover, the ADC circuit 114 may readily be a part of an integrated metering chip package.

The processing circuit 116 is a device that employs one or more processing devices such as microprocessors, microcontrollers, digital signal processors, discrete digital circuits and combinations of these devices. As mentioned above, the processing circuit 116 is operable to generate energy consumption data based on the digital signals. As discussed below, the processing circuit 116 repetitively integrates a voltage or current waveform to remove harmonic distortion from the signal for more accurate calculation of fundamental frequency only electrical parameter measurements, such as the root-mean-square voltage, root-mean-square current, active energy, and reactive energy, all at the fundamental frequency. Additionally, the processing circuit 116 may generate VA, VAh, watt-hours, VAR-hrs, power factor, or combinations of any these measurements. Various processing circuits operable to generate energy consumption data from digital voltage and digital current measurement signals are well known in the art. Suitable examples of such circuits are described in U.S. Pat. Nos. 6,374,188; 6,564,159; 6,121, 158; and 5,933,004. However, in one preferred embodiment, the processing circuit is (or includes) a processing element of a metering integrated circuit chip such as the Teridian MAX71071 measurement circuit available from MAXIM Integrated. In that embodiment, both the ADC circuit 114 and the processing circuit 116 are disposed within the same semiconductor package.

Figure 7:
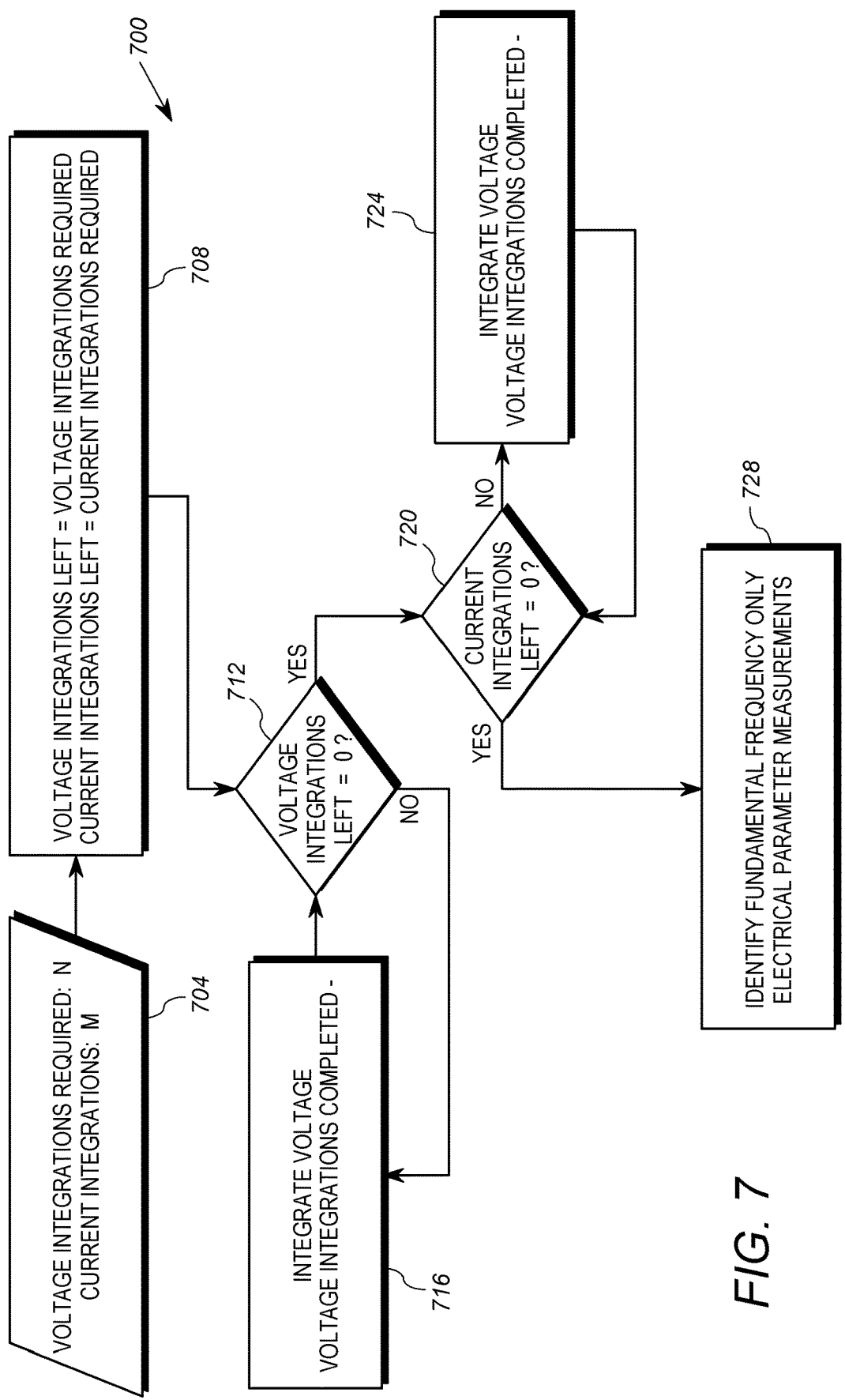
FIG. 7 is a flow diagram of the operation of a processing circuit to filter harmonic distortion from a waveform in accordance with at least one embodiment of the present invention.

The processing circuit 116 is further operable to store the plurality of energy consumption values in the data store 112. In some embodiments, the processing circuit 116 may store energy consumption values for each of plurality of time periods, in order to allow analysis of energy usage at different times of day, days of the week or month, or even seasonally. The storage of consumption indexed to time periods is known in the industry as "load profiling". The data store 112 may suitably be a random access memory, EEPROM, other memory, or a combination of several types of memory. In still other embodiments, the data store 112 may include a circular buffer, FIFO device, or other memory that stores data in the order in which it is received. Other known methods may be used. In at least some embodiments, the data store 112 includes memory located within the integrated package that houses the processing circuit 116. The data store 112 also includes a software program that is executed by the processing circuit 116 to perform the operations of the processing circuit 116 described in this document, including those of FIG. 7.

The communication circuit 118 is a device that is in some embodiments configured to communicate data between the metering unit 10 and one or more remote devices. In a system such as that shown in FIG. 1, the communication circuit 118 is operable to communicate directly or indirectly with a data collection system of a utility service provider. Several of such systems are known. The utility service provider then uses the collected data to generate billing information and data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other communication devices may operate in the kHz or low MHZ range. Additionally or alternatively, the communication circuit 118 can be configured to communicate with a locally coupled device, such as a reed switch, portable computing device, or other device. The communication circuit 118 may include an optical or electrical data port, not shown, for this purpose.

The meter display 120, which is optional, may be a digital display such as a liquid crystal display. While the exact nature of the display is not particularly important to the implementation of the invention, the inclusion of at least some display capability provides advantages for use of the meter. LCD displays, moreover, have been found to provide a particularly advantageous set of qualities for use in electronic meters.

FIG. 2 show a schematic representation of the meter 10 coupled between a source 200 and a load 201 in a four-wire delta electrical service. The four-wire delta electrical source 200 includes a delta power source (transformer) as is known in the art. The electrical source 200 is operably coupled to provide three-phase delta-wired electrical service to the load 201 via a phase A line 212, a phase B line 214, a phase C line 216 and a neutral line 218 defined between the phase A line 212 and the phase B line 214. As is known in the art, the meter 10 generally meters the energy (and related values) delivered to the load 201 from the source 200. The load 201 includes elements of a customer load, and may include resistive, inductive and capacitive loads. The load 201 may be balanced, or may be imbalanced, meaning that different loads may be connected from phase A to phase B, from phase B to phase C, from phase C to phase A, and additional loads may be connected from phase A to neutral, phase B to neutral and phase C to neutral.

In general, the meter 10 is operably connected to obtain the voltage measurements $V_A$, $V_B$, and $V_C$, and the current measurements $I_A$, $I_B$, $I_C$ and $I_N$. More specifically, the scaling unit 110 is operably coupled to generate voltage measurement signals $V_A$, $V_B$, $V_C$, $I_A$, $I_B$, $I_C$ and $I_N$, and provide those signals to the ADC circuit 114. In several embodiments described herein, only three of the four current values $I_A$, $I_B$, $I_C$ and $I_N$ need be digitized and stored. Typically $I_N$ is not digitized because it is usually derived from the sum of $I_A$, $I_B$, and $I_C$.

The signal $V_A$ represents a scaled version of the voltage from the phase A line 212 to neutral 218. The signal $V_B$ represents a scaled version of the voltage from the phase B line 214 to neutral 218, and the signal $V_C$ represents a scaled version of the voltage from the phase C line 216 to neutral 218. The signal $I_A$ represents a scaled version of the current on the phase A line 212, signal $I_B$ represents a scaled version of the current on the phase B line signal 214, and $I_C$ represents a scaled version of the current on the phase C line 216. The signal $I_N$ represents a scaled version of the current on the neutral line 218.

The ADC circuit 114, in turn, contemporaneously samples each of the waveforms $V_A$, $V_B$, $V_C$, $I_A$, $I_B$, $I_C$ and $I_N$, and generates corresponding digital sample streams $V_A(s)$, $V_B(s)$, $V_C(s)$, $I_A(s)$, $I_B(s)$, $I_C(s)$, and $I_N(s)$. The value s represents a sample index, which corresponds directly to a time increment. The sample rate s/sec is typically many times the fundamental cycle frequency of the AC waveform, such that the samples collectively provide an accurate sampled representation of the corresponding analog waveform. The minimum sample rate is the Nyquist frequency, which is twice the highest frequency in the monitored waveform. The operations of the scaling unit 110 and the ADC circuit 114 as discussed above are conventional.

Some specifications, such as certain International Electrotechnical Commission (IEC) specifications, require electrical energy meters to make accurate measurements for aggregate metrics, which contain all frequency components of the monitored signal, while some markets, such as Canada, require that the meter provide energy measurements based only on the fundamental frequency. These measurements remove energy present in the harmonics of the fundamental frequency. While the removal of the harmonic distortion present in these harmonics is possible by augmenting the circuitry associated with the processing circuit 116 with other filtering components, the meter and method described below use existing resources available in the processing circuit 116 for that purpose. Thus, the measurements of electrical parameters at the fundamental frequency are made more efficiently and do not require existing meters to be retrofitted with additional components. Instead, the programmed instructions executed by the processing circuit 116 are modified to use existing capabilities in the processing circuit to obtain the electrical parameter measurements without the harmonic distortions in the harmonics of the fundamental frequency.

Generally, voltage potential with both fundamental and harmonic frequencies can be expressed as:

$$V(t) = \sum_{n=1}^{N} V_n \sin(2\pi n f_0 t + \theta_n)$$

Integrating the above with respect to time:

$$\int \sum_{n=1}^{N} V_n \sin(2\pi n f_0 t + \theta_n) dt = \frac{-1}{2\pi f_0} \sum_{n=1}^{N} \frac{1}{n} V_n \cos(2\pi f_0 t + \theta_n) + C_0$$

then scaling the integration by $-2\pi f_0$ and removing the constant of integration $C_0$ provides the first approximation to the quadrature of the potential:

$$\tilde{V}(t) = \sum_{n=1}^{N} \frac{1}{n} V_n \cos(2\pi n f_0 t + \theta_n)$$

Performing the integration and scaling for any odd number of iterations results in an approximation to the voltage quadrature, with each $n^{th}$ harmonic component being reduced by the scaling factor $1/n^i$ (where i is the $i^{th}$ integration):

$$\overline{V}_i(t) = \sum_{n=1}^{N} \frac{1}{n^i} V_n \cos(2\pi n f_0 t + \theta_n)$$

Figure 3A:
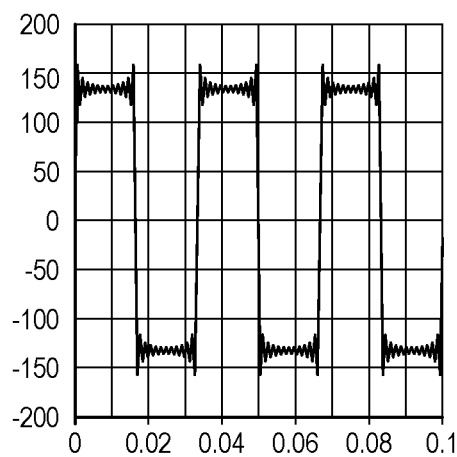
FIGS. 3A and 3B depict a simulated voltage waveform having harmonic distortion and the harmonic spectrum of the distortion.

This process was simulated with a computer using Matlab. A voltage waveform with substantial harmonic content was generated and then processed by a three-stage integration. The generated voltage waveform contained odd harmonics up to the $23^{rd}$ harmonic and the magnitudes of the harmonics were inversely proportional to the number of the corresponding harmonic. The simulated waveform is a good approximation of a rectangular waveform and is shown in FIG. 3A. The voltage waveform takes the form:

$$V(t) = \sum_{k=0}^{11} \frac{120\sqrt{2}}{2k+1} \sin(2\pi(2k+1)f_0 t)$$

Figure 3B:
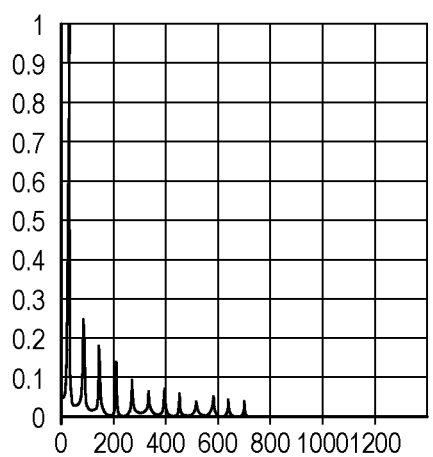

The total harmonic distortion for this waveform is 46.1% and the harmonic spectrum of the waveform is shown in FIG. 3B.

Figure 4A:
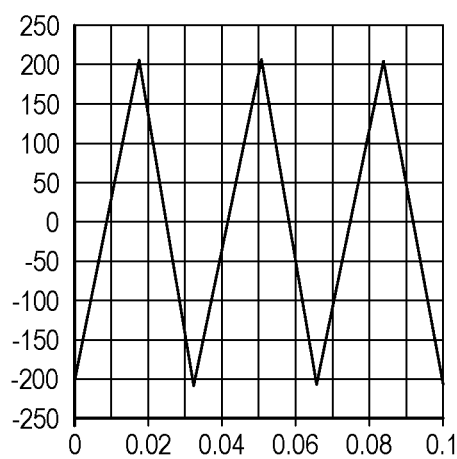
FIGS. 4A and 4B depict the simulated voltage waveform of FIG. 3A after one stage of integration and the harmonic spectrum of the remaining distortion.
Figure 4B:
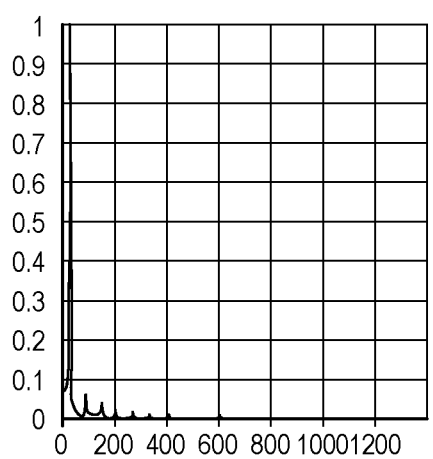

After the first stage of integration, the total harmonic distortion is reduced to 12.1% and the resulting waveform is shown in FIG. 4A with its harmonic spectrum shown in FIG.

Figure 5A:
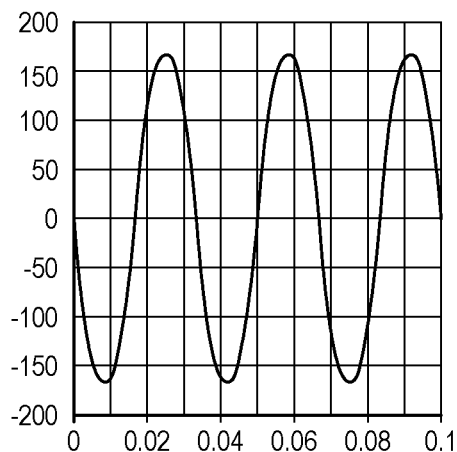
FIGS. 5A and 5B depict the simulated voltage waveform of FIG. 3A after the second stage of integration and the harmonic spectrum of the remaining distortion.
Figure 5B:
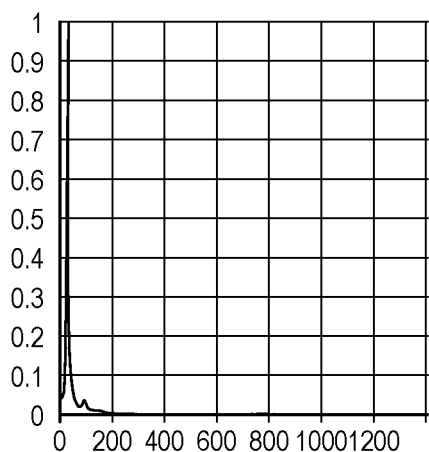
Figure 6A:
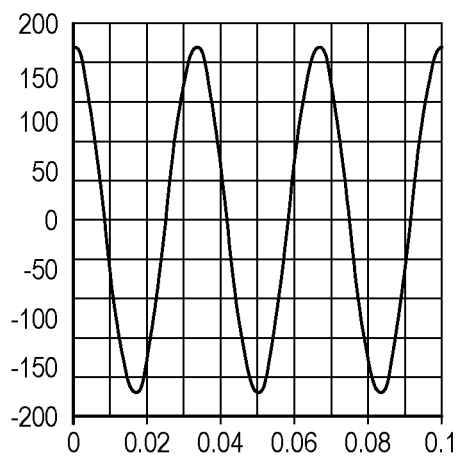
FIGS. 6A and 6B depict the simulated voltage waveform of FIG. 3A after the third stage of integration and the harmonic spectrum of the remaining distortion.
Figure 6B:
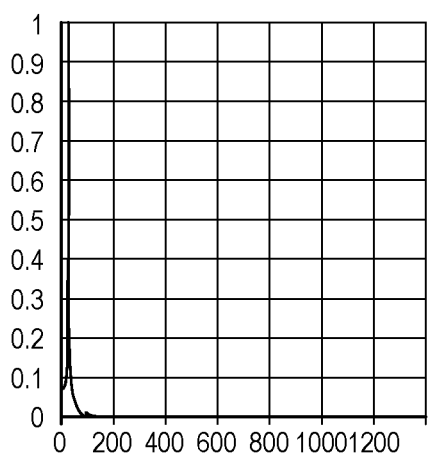

4B. After the second stage of integration the total harmonic distortion is reduced to 3.8% and the resulting waveform is shown in FIG. 5A with its harmonic spectrum shown in FIG. 5B. After the third stage of integration, the total harmonic distortion is reduced to 1.2% and the resulting waveform is shown in FIG. 6A with its harmonic spectrum shown in FIG. 6B. After three stages of integration, the total harmonic distortion of this simulated voltage waveform has been reduced by 44.9% with respect to the initial total harmonic distortion (THD) of the voltage waveform. The odd number of integration stages also produces the voltage quadrature component that can be used for reactive power computation, which is measured in VARs.

As can be seen in the figures, each integration stage filters a portion of the non-fundamental components of the signal. The portion of any given harmonic, N, that remains in a signal after an integration stage is 1/N. Since the integrator is already available in the processing circuit 116, the circuit can be configured with additional programmed instructions to loop a voltage or current waveform sample stream through the integrator multiple times to achieve a highly filtered signal. The portion of harmonic content that remains in the resulting signal is: $(1/N)^M$, where N is the harmonic number and M is the number of integrations used. Multiple integrations can be applied a voltage or current waveform sample stream to achieve a fundamental frequency only voltage and a fundamental only current, respectively, and these values can be used to obtain an active energy value and an reactive energy value for the fundamental frequency. For example, the fundamental frequency only reactive energy can be obtained by integrating the voltage signal five times and multiplying the result by the non-integrated current sample. The number of integrations is balanced between the amount of filtering needed and the delay that can be tolerated for obtaining the filtration as there is a ¼ cycle delay for the integration stage to be primed at start-up.

The multiple integrations of a voltage or current sample can be used to obtain a number of accurate fundamental frequency only measurements. Among these are the following:

(1) Integrating the voltage any number of times, M, before using the filtered value in an RMS calculation to identify the fundamental frequency only electrical parameter measurement for voltage with harmonics filtered at a rate of $(1/N)^M$.

(2) Integrating the current any number of times, M, before using the filtered value in an RMS calculation to identify the fundamental frequency only electrical parameter measurement for current with harmonics filtered at a rate of $(1/N)^M$.

(3) Integrating the voltage and current any number of times, M, before multiplying them together to identify the fundamental frequency only electrical parameter measurement for true power in watts with harmonics filtered at a rate of $(1/N)^M$.

(4) Integrating the voltage any number of times, 4*M, before multiplying the filtered value with the non-integrated contemporaneous current sample to identify the fundamental frequency only electrical parameter measurement for true power in watts with harmonics filtered at a rate of $(1/N)^{4M}$.

(5) Integrating the voltage any number of times, 2*M, before multiplying the filtered value with the contemporaneous non-integrated current sample and inverting the sign to identify the fundamental frequency only electrical parameter measurement for true power in watts with harmonics filtered at a rate of $(1/N)^{2M}$.

(6) Integrating the current any number of times, 4*M, before multiplying the filtered value with the non-integrated contemporaneous voltage sample to identify the fundamental frequency only electrical parameter measurement for true power in watts with harmonics filtered at a rate of $(1/N)^{4M}$.

(7) Integrating the current any number of times, 2*M, before multiplying the filtered value with the non-integrated contemporaneous voltage sample and inverting the sign to identify the fundamental frequency only electrical parameter measurement for true power in watts with harmonics filtered at a rate of $(1/N)^{2M}$.

(8) Integrating the voltage any number of times, M+1, and the current any number of times, M, before multiplying the filtered values together to identify the fundamental frequency only electrical parameter measurement for reactive power in VARs with harmonics filtered at a rate of $(1/N)^{M+1}$.

A process 700 that can be implemented by the meter described above is shown in FIG. 7. In the description of the process, statements that the process is performing some task or function refers to a controller or general-purpose processor executing programmed instructions stored in non-transitory computer readable storage media operatively connected to the controller or processor to manipulate data or to operate one or more components in the printer to perform the task or function. The processing circuit 116 noted above can be such a controller or processor. Alternatively, the controller can be implemented with more than one processor and associated circuitry and components, each of which is configured to form one or more tasks or functions described in this document. Additionally, the steps of the method may be performed in any feasible chronological order, regardless of the order shown in the figures or the order in which the processing is described.

The process 700 requires that the number of voltage integrations N and the number of current integrations M be passed to the processing circuit for execution of the programmed instructions that implement the process (block 704). The number of voltage integrations left to perform is initialized to the number N and the number of voltage integrations left to perform is initialized to the number M (block 708). If the number of voltage integrations left is non-zero (block 712), then a voltage sample is integrated (block 716). The number of voltage integrations left is decremented by one and the result of the integration is integrated again if the number of voltage integrations left is non-zero (blocks 712 and 716). Once the number of voltage integrations left reduces to zero, the voltage sample has been integrated N times. The process then determines whether the number of current integrations left is non-zero (block 720), then a current sample contemporaneously generated with the voltage sample already filtered is integrated (block 724). The number of current integrations left is decremented by one and the result of the integration is integrated again if the number of current integrations left is non-zero (blocks 720 and 724). Once the number of current integrations left reduces to zero, the current sample has been integrated M times. The integrated values of the voltage and current can then be used in the calculations identified above for the eight electrical parameter measurements according to the number of times the current, the voltage, or both were integrated (block 728). The fundamental frequency only electrical parameter measurements can be stored, displayed, and transmitted.

The reader should appreciate that the above describe embodiments are merely illustrative, and that those of ordinary skill in the art may readily devise their own modifications and implementations that incorporate the principles of the present invention and fall within the spirit and scope thereof.

We claim:

1. An electrical energy meter comprising:
   a) an A/D converter configured to generate contemporaneously digital samples of voltage and current waveforms in a polyphase electrical system; and
   b) a processing circuit operably coupled to receive the digital samples of voltage and current waveforms from the A/D converter, the processing circuit configured to:
      integrate over time at least one of the digital samples of the voltage waveform or the digital samples of the current waveform multiple times to produce a filtered value from which harmonic distortion has been removed;
      identify a fundamental frequency only electrical parameter measurement for the polyphase electrical system with reference to the filtered value; and
      store the identified fundamental frequency only electrical parameter measurement in a data store.

2. The electrical energy meter of claim 1, the processing circuit being further configured to:
   integrate the at least one contemporaneous digital sample of the voltage waveform any number of times, M, before using the filtered value for the voltage waveform in an RMS calculation to identify the fundamental frequency only electrical parameter measurement for voltage with harmonics filtered at a rate of $(1/N)^M$, where N is a harmonic number.

3. The electrical energy meter of claim 1, the processing circuit being further configured to:
   integrate the at least one contemporaneous digital sample of the current waveform any number of times, M, before using the filtered value for the current waveform in an RMS calculation to identify the fundamental frequency only electrical parameter measurement for current with harmonics filtered at a rate of $(1/N)^M$, where N is a harmonic number.

4. The electrical energy meter of claim 1, the processing circuit being further configured to:
   integrate the at least one contemporaneous digital sample for the voltage waveform and the at least one contemporaneous digital sample for the current waveform any number of times, M, before multiplying the filtered value for the voltage waveform with the filtered value for the current waveform to identify the fundamental frequency only electrical parameter measurement for true power in watts with harmonics filtered at a rate of $(1/N)^M$, where N is a harmonic number.

5. The electrical energy meter of claim 1, the processing circuit being further configured to:
   integrate the at least one contemporaneous digital sample for the voltage waveform any number of times, 4*M, before multiplying the filtered value for the voltage waveform with the at least one contemporaneous digital sample for the current waveform that has not been integrated to get the fundamental frequency only electrical parameter measurement for true power in watts with harmonics filtered at a rate of $(1/N)^{4M}$, where N is a harmonic number.

6. The electrical energy meter of claim 1, the processing circuit being further configured to:
   integrate the at least one contemporaneous digital sample for the voltage waveform any number of times, 2*M, before multiplying the filtered value for the voltage waveform with the at least one contemporaneous digital sample for the current waveform to produce a product and inverting a sign of the product to identify the fundamental frequency only electrical parameter measurement for true power in watts with harmonics filtered at a rate of $(1/N)^{2M}$, where N is a harmonic number.

7. The electrical energy meter of claim 1, the processing circuit being further configured to:
   integrate the at least one contemporaneous digital sample for the current waveform any number of times, 4*M, before multiplying the filtered value for the current waveform with the at least one contemporaneous digital sample for the voltage waveform to identify the fundamental frequency only electrical parameter measurement for true power in watts with harmonics filtered at a rate of $(1/N)^{4M}$, where N is a harmonic number.

8. The electrical energy meter of claim 1, the processing circuit being further configured to:
   integrate the at least one contemporaneous digital sample for the current waveform any number of times, 2*M, before multiplying the filtered value for the current waveform with the at least one contemporaneous digital sample for the voltage waveform to produce a product and inverting a sign of product to identify the fundamental frequency only electrical parameter measurement for true power in watts with harmonics filtered at a rate of $(1/N)^{2M}$, where N is a harmonic number.

9. The electrical energy meter of claim 1, the processing circuit being further configured to:
   integrate the at least one contemporaneous digital sample for the voltage waveform any number of times, M+1, and the at least one contemporaneous digital sample for the current waveform any number of times, M, before multiplying the filtered value for the voltage waveform and the filtered value for the current waveform together to identify the fundamental frequency only electrical parameter measurement for reactive power in VARs with harmonics filtered at a rate of $(1/N)^{M+1}$, where N is a harmonic number.

10. The electrical energy meter of claim 1, the processing circuit being further configured to:
    integrate the at least one of the digital samples of the voltage waveform or the digital samples of the current waveform M times to produce the filtered value, wherein harmonics of the digital samples of the voltage waveform or the digital samples of the current waveform are filtered at a rate of $(1/N)^M$, where N is a harmonic number.

11. A method of operating an electrical energy meter comprising:
    generating contemporaneously with an A/D converter digital samples of voltage and current waveforms in a polyphase electrical system;
    receiving with a processing circuit the digital samples of voltage and current waveforms from the A/D converter;
    integrating with the processing circuit over time at least one of the digital samples of the voltage waveform or the digital samples of the current waveform multiple times to produce a filtered value from which harmonic distortion has been removed;
    identifying with the processing circuit a fundamental frequency only electrical parameter measurement for the polyphase electrical system with reference to the filtered value; and
    storing the identified fundamental frequency only electrical parameter measurement in a data store.

12. The method of claim 11 further comprising:
integrating with the processing circuit the at least one contemporaneous digital sample of the voltage waveform any number of times, M, before using the filtered value for the voltage waveform in an RMS calculation to identify the fundamental frequency only electrical parameter measurement for voltage with harmonics filtered at a rate of $(1/N)^M$, where N is a harmonic number.

13. The method of claim 11 further comprising:
integrating with the processing circuit the at least one contemporaneous digital sample of the current waveform any number of times, M, before using the filtered value for the current waveform in an RMS calculation to identify the fundamental frequency only electrical parameter measurement for current with harmonics filtered at a rate of $(1/N)^M$, where N is a harmonic number.

14. The method of claim 11 further comprising:
integrating with the processing circuit the at least one contemporaneous digital sample for the voltage waveform and the at least one contemporaneous digital sample for the current waveform any number of times, M, before multiplying the filtered value for the voltage waveform with the filtered value for the current waveform to identify the fundamental frequency only electrical parameter measurement for true power in watts with harmonics filtered at a rate of $(1/N)^M$, where N is a harmonic number.

15. The method of claim 11 further comprising:
integrating with the processing circuit the at least one contemporaneous digital sample for the voltage waveform any number of times, 4*M, before multiplying the filtered value for the voltage waveform with the at least one contemporaneous digital sample for the current waveform that has not been integrated to get the fundamental frequency only electrical parameter measurement for true power in watts with harmonics filtered at a rate of $(1/N)^{4M}$, where N is a harmonic number.

16. The method of claim 11 further comprising:
integrating with the processing circuit the at least one contemporaneous digital sample for the voltage waveform any number of times, 2*M, before multiplying the filtered value for the voltage waveform with the at least one contemporaneous digital sample for the current waveform to produce a product and inverting a sign of the product to identify the fundamental frequency only electrical parameter measurement for true power in watts with harmonics filtered at a rate of $(1/N)^{2M}$, where N is a harmonic number.

17. The method of claim 11 further comprising:
integrating with the processing circuit the at least one contemporaneous digital sample for the current waveform any number of times, 4*M, before multiplying the filtered value for the current waveform with the at least one contemporaneous digital sample for the voltage waveform to identify the fundamental frequency only electrical parameter measurement for true power in watts with harmonics filtered at a rate of $(1/N)^{4M}$, where N is a harmonic number.

18. The method of claim 11 further comprising:
integrating with the processing circuit the at least one contemporaneous digital sample for the current waveform any number of times, 2*M, before multiplying the filtered value for the current waveform with the at least one contemporaneous digital sample for the voltage waveform to produce a product and inverting a sign of product to identify the fundamental frequency only electrical parameter measurement for true power in watts with harmonics filtered at a rate of $(1/N)^{2M}$, where N is a harmonic number.

19. The method of claim 11 further comprising:
integrating with the processing circuit the at least one contemporaneous digital sample for the voltage waveform any number of times, M+1, and the at least one contemporaneous digital sample for the current waveform any number of times, M, before multiplying the filtered value for the voltage waveform and the filtered value for the current waveform together to identify the fundamental frequency only electrical parameter measurement for reactive power in VARs with harmonics filtered at a rate of $(1/N)^{M+1}$, where N is a harmonic number.

20. The method of claim 11 wherein integrating with the processing circuit over time at least one of the digital samples of the voltage waveform or the digital samples of the current waveform multiple times to produce a filtered value from which harmonic distortion has been removed, comprises:
integrating with the processing circuit the at least one of the digital samples of the voltage waveform or the digital samples of the current waveform M times to produce the filtered value, wherein harmonics of the digital samples of the voltage waveform or the digital samples of the current waveform are filtered at a rate of $(1/N)^M$, where N is a harmonic number.

* * * * *